United States Patent [19]

Rodloff et al.

[11] Patent Number: 4,639,630

[45] Date of Patent: Jan. 27, 1987

[54] PIEZOCERAMIC SERVO-DRIVE FOR PRODUCING TRANSLATIONAL MOTION, ESPECIALLY FOR APPLICATION TO RING LASER MIRRORS

[75] Inventors: Rüdiger K. Rodloff, Meinersen; Werner W. Jungbluth, Königslutter, both of Fed. Rep. of Germany

[73] Assignee: Deutsche Forschungs- und Versuchsanstalt fur Luft- und Raumfahrt e.V., Cologne, Fed. Rep. of Germany

[21] Appl. No.: 716,324

[22] Filed: Mar. 26, 1985

[30] Foreign Application Priority Data

Mar. 31, 1984 [DE] Fed. Rep. of Germany ....... 3412014

[51] Int. Cl.$^4$ ............................................. H01L 41/08
[52] U.S. Cl. .................................... 310/328; 310/358; 310/366
[58] Field of Search .................. 310/328, 330–332, 310/366, 358

[56] References Cited

U.S. PATENT DOCUMENTS

| | | | |
|---|---|---|---|
| 3,581,227 | 5/1971 | Podgorski | 356/106 X |
| 3,903,435 | 9/1975 | Bouygues et al. | 310/328 |
| 3,904,274 | 9/1975 | Feinleib et al. | 310/328 X |
| 4,087,715 | 5/1978 | Myer | 310/328 X |
| 4,113,387 | 9/1978 | Shutt | 310/332 |
| 4,342,935 | 8/1982 | Kallmeyer et al. | 310/328 |

FOREIGN PATENT DOCUMENTS

| | | | |
|---|---|---|---|
| 0070787 | 6/1977 | Japan | 310/328 |
| 1477456 | 6/1977 | United Kingdom | 310/328 |
| 2013966 | 8/1979 | United Kingdom | 310/328 |

Primary Examiner—Mark O. Budd
Attorney, Agent, or Firm—Salter & Michaelson

[57] ABSTRACT

A piezoceramic servo-drive for producing translational and angular movement, especially for application to ring laser mirrors, and including piezo discs arranged in a column. The discs are polarised in such a way that the direction of extension of the column and the direction of the electrical field lie in parallel. The discs are provided on one side with a complete contact surface and on the other side are divided into electrically separate contact segments which are provided with separate electrical connections.

3 Claims, 7 Drawing Figures

PIEZOCERAMIC SERVO-DRIVE FOR PRODUCING TRANSLATIONAL MOTION, ESPECIALLY FOR APPLICATION TO RING LASER MIRRORS

FIELD OF THE INVENTION

The invention relates to a piezoceramic servo-drive for producing translational movement, especially for application to ring laser mirrors, the servo-drive being of the kind, hereinafter called the kind specified including piezo discs arranged in a column, the said discs being polarised in such a way that the direction of extension of the column and the direction of the electrical field lie in parallel and being provided on both sides with contact surfaces.

DESCRIPTION OF THE PRIOR ART

Piezoceramic servo-drives of the kind specified find application, for example, in the parallel adjustment of corner mirrors in ring lasers. They are used for keeping the optical path length or the length of the resonance cavity of the ring laser constant. (U.S. Pat. No. 3,581,227).

It is known that thermal or mechanical deformation of the central block of a ring laser type of gyro not only results in length errors, which can be corrected by translational movement of the mirrors, but also in bending, for the compensation of which the mirrors need to be tiltable. A known arrangement of a piezoceramic servo-drive which allows both a translational movement and tilting of the mirrors involves a bimorph adjusting element comprising two piezoceramic plates, between which an electrically conductive plate is arranged, and on the outside of the piezoceramic plates individually arranged segmented contact plates. Facing contact plates are connected in parallel to respective terminals of a voltage source. Asymmetrical voltage gradients result in a rotational movement in the centre of the adjusting element which is transferred to the mirror via a transmission element. The disadvantage in such an arrangement in which the piezoceramic plates are 31 contacted is in the fact that only a reduced torque is available for the adjustment movement and that the mirror is badly-guided during the rotational movement (U.S. Pat. No. 4,113,387).

The object of the invention is to create a piezoceramic servo-drive of the kind specified, with which high operating torque a tilting motion can be produced, whereby at the same time the servo-drive itself makes possible highly accurate guiding of the component controlled by the servo-drive.

SUMMARY OF THE INVENTION

This problem is solved according to the invention in that the contact surface on one side of at least one of said discs is divided symmetrically into electrically separate segments and in that the contact segments are provided with separate electrical connections.

Either two or four symmetrical contact segments may be provided on a side of at least one of said discs.

The column may include additional piezo discs provided on each side thereof with a continuous contact surface.

The column is preferably prestressed between a solid support and a component to be adjusted, in such a way that the contact segments are symmetrical with respect to the axis of tilt.

BRIEF DESCRIPTION OF THE DRAWINGS

The invention is illustrated by way of example in the drawings and is subsequently described in detail with the aid of the drawings, in which.

DESCRIPTION OF THE PREFERRED EMBODIMENTS

In the servo-drive according to the invention, preferably circular piezoceramic discs 2 are used, the piezoceramic material being provided on both sides with contact surfaces 4, 6, 8. The contact surface 4 on one side is a continuous contact surface, while on the opposite side the contact surface is divided symmetrically into two separate electrically-insulated contact segments 6, 8 which are arranged symmetrically on either side of a line of symmetry x.

Figure 1:
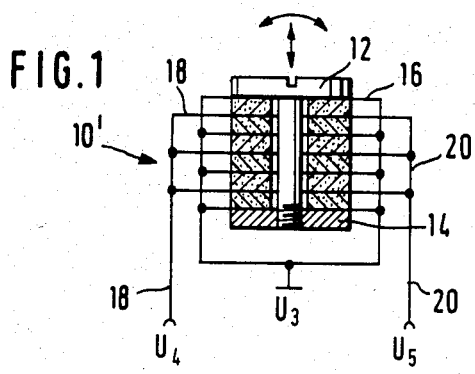
FIG. 1 shows a first embodiment of servo-drive according to the invention.

The servo-drive 10 which is shown in FIG. 1 comprises a column or stack of piezoceramic discs 2 which are arranged on a support element 12 in the form of a screw. The discs are mounted on the support element 12 by a nut 14.

The contact surfaces 4, 6 and 8 are each provided with separate electrical connections. The connections 16 of the continuous contact surfaces are connected in parallel and are connected to a common potential $U_3$. The connections 18, which are assigned by way of example to the contact surfaces 6, are connected to a potential $U_4$ and the connections 20, which are assigned to the contact surfaces 8 are connected to a potential $U_5$. The line of symmetry x of the two contact surfaces 6, 8 lies perpendicular to the plane of the paper in FIG. 1.

The piezoceramic discs 2 are polarised in such a way that the direction of extension and the direction of the electrical field lie in parallel (33 contacted). The potential $U_3$ can be zero potential. Should a positive direct current voltage of similar magnitude then be applied at connections 18 and 20 the column of piezoceramic discs extends if the polarisation in the piezoceramic discs is of similar polarity to the voltage. Should the voltage at 18 and 20 be negative then the column contracts. The servo-drive is responsible for a translational movement, as is shown by the double-headed arrow drawn axially in FIG. 1. In order to avoid depolarisation effects, fields in excess of 500 V/mm. are to be avoided in the case of most known piezo materials.

Figure 2:
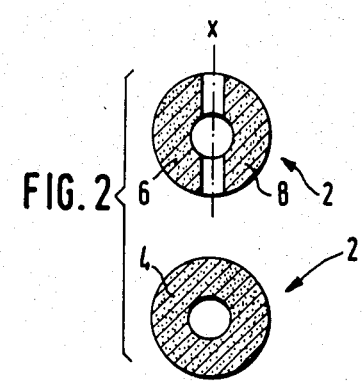
FIG. 2 shows in plan view the two sides of a piezo disc according to the invention.

Should the voltages $U_4$ and $U_5$ at the connections 18 and 20 be set asymmetrically then various extensions and/or contractions occur in the area of contact segments 6 and 8. The servo-drive is therefore subject not only to a translational movement but also to a tilting of the head of the screw 12, as indicated by the double-headed curved arrow in FIG. 1. As a function of the relationship between the two control voltages $U_4$ and $U_5$, all transitional forms of motion can be set by means of this piezo servo-drive from solely tilting, when $U_4$ and $U_5$ are of similar magnitude but have opposing signs, to solely translational movement, when $U_4$ and $U_5$ are identical in magnitude and sign. Tilting about at least two axes can be achieved with the embodiment of the piezoceramic discs according to FIG. 3. In the case of the disc 22 represented here, one side is provided with a continuous contact surface as in the case of the embodiment according to FIG. 2. On the opposite side of the disc four contact segments 24, 26, 28 and 30 are provided lying symmetrically to the axes of symmetry x and y which are perpendicular to one another. Each of these four contact segments is provided with an electrical connection. The four contact segments can therefore be connected alternatively to two voltage potentials. By electrical interconnection of the contact segments 24 and 26 on the one side and 28 and 30 on the other side, tilting can be effected about the y-axis and by electrical interconnection of the contact segments 24 and 28 on the one side and 26 and 30 on the other side, tilting can be effected about the x-axis. In this way, tilting can be effected about two axes displaced by 90°. It is also possible to connect two respectively diametrically-opposite contact segments i.e. 24 and 30 or 26 and 28 to different voltage potentials. In this way tilting can be achieved about axes of tilting shifted by 45° in relation to the x and y axes. By connecting all four contact segments 24, 26, 28 and 30 to the same voltage potential a translational movement is produced.

Figure 3:
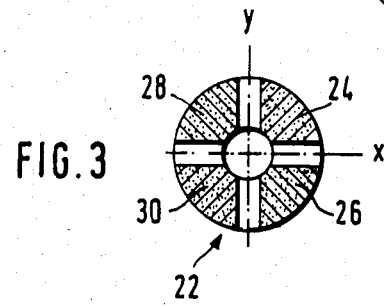
FIG. 3 shows in plan view a further embodiment of a piezo disc according to the invention.
Figure 4:
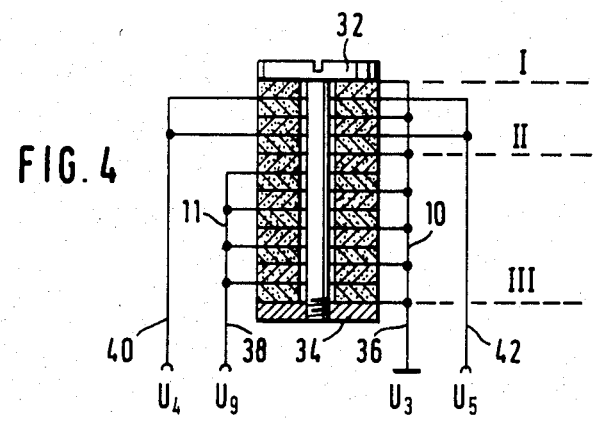
FIG. 4 shows a further embodiment of a servo-drive according to the invention.

A modified embodiment of a servo-drive is represented in FIG. 4. Here again, a column of piezoceramic discs is arranged on a support 32 in the form of a screw, the piezoceramic discs being pressed together by a nut 34. The discs between the broken lines I and II are here designed according to FIG. 2 or FIG. 3. These discs produce the tilting motion. Piezoceramic discs which are fully contacted on either side are arranged between the broken lines II and III. These discs effect a length alteration. All continuous contact surfaces on one side of the piezoceramic discs in both sets are connected to a connection 10 to which a potential $U_3$ is applied. The opposite contact surfaces of the piezoceramic discs in the region II-III are connected to a connection 11 to which a potential $U_9$ is applied. The contact surfaces 6 and 8 of the piezoceramic discs in the region I-II are connected respectively to a connection 40 or 42 at the potentials $U_4$ and $U_5$. In addition, it is of course possible also to provide switching devices to connect both connections 40 and 42 to the connection 38 and therefore to the potential $U_9$ and therefore to use the whole column of piezoceramic discs for effecting a length alteration if, in the case of a reduced tilting requirement, substantial length alterations are to be effected with the shortest possible overall length of the servo-drive.

Figure 5:
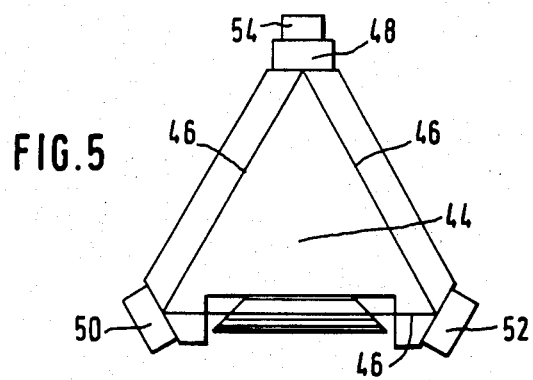
FIG. 5 is a schematic representation of a ring laser.

In FIG. 5 a laser type of gyro is shown schematically in plan view. On the block 44 having therein cavities 46 for the beam path there are three corner mirrors 48, 50 and 52, corner mirror 48 being provided with a servo-drive 54 designed in the way described hereinbefore. This mirror 48 is shown enlarged in FIG. 6. The block 44 is here provided with a ground contact surface 56, on which there is the mirror arrangement 48. The mirror arrangement 48 is a unitary design and comprises a mirror holder 58 which is in a membrane 60 which lies symmetrically within a frame 62 by which the mirror arrangement is connected with the surface 56. In a support disc 64 there is a holder 66 for a servo-drive 68, which engages at one end in an opening 70 on the back of the mirror holder 58. The servo-drive is held in contact against the back of the mirror holder 58 under initial compression by means of distance washers 72. Given appropriate initial compression, the tilting and translational movements of the servo-drive are transferred very precisely to the mirror holder 58. Because of the relatively high driving torque which can be applied via the servo-drive, the mirror membrane 60 can have a relatively rigid design. The mirror can therefore be designed in such a way as to be insensitive to translational and rotational acceleration. This represents a considerable advantage in the case of laser type of gyros which must be dithered around its vertical axis to overcome the problem of lock-in.

Figure 6:
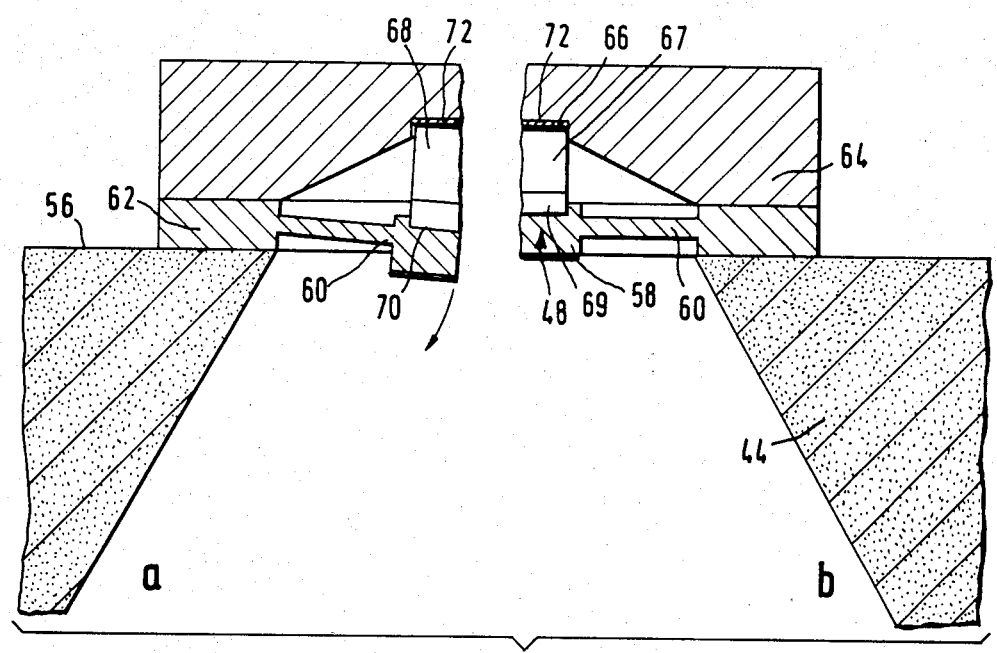
FIG. 6 shows an embodiment of a corner mirror of a ring laser with an adjusting element according to the invention in section and illustrates two positions of the corner mirror.

In the case of the embodiment according to FIG. 6 the servo-drive 68 is designed in a way corresponding to the servo-drive according to FIG. 4, i.e., with a first column or stack 67 of piezo discs which produce solely translational movement and a second column or stack 69 of piezo discs by which a tilting motion can be produced. The servo-drive 68 could, however, comprise in the way described hereinbefore only piezo discs having symmetrical contact surfaces divided into electrically separate contact segments. In FIG. 6, the mirror holder 58 is shown in an initial position at the right of centre in which the servo-drive has its shortest length. At the left of centre, the servo-drive 68 is shown in a position in which both translational and tilting movement are achieved, this position illustrating by way of example the mirror holder 58 in the case of the maximum extension of the column 67 and maximal tilt of the column 69. The representation in this drawing is greatly exaggerated. In practice the translational motion is in the order of up to 50 $\mu$m and the tilt is up to a few ten minutes of arc.

With the described servo-drive, it is possible to produce a relatively large stroke to keep the beam path constant. Moreover, tilting of the corner mirrors about their horizontal axes lying in the plane of the beam or perpendicular thereto is effected with a high level of precision. In general, tilt angles of between 1 and 2 minutes of arc are sufficient for the compensation of thermal or mechanical distortions of the block 44 in case of a laser type of gyro. This requirement is fulfilled with distinction by the described servo-drives.

Figure 7:
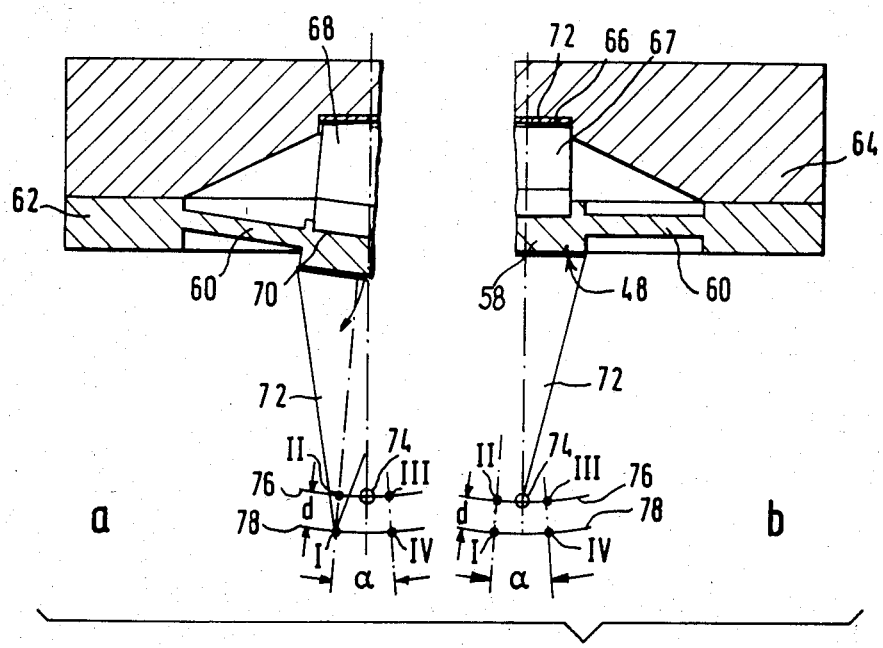
FIG. 7 is a schematic representation of a micro-positioner in section and illustrates two positions of the control arm.

FIG. 7 illustrates an embodiment in which the servo-drive is a micropositioner drive. For simplicity, the same basic design is shown here as in the case of FIG. 6. Like parts are therefore provided with like reference characters. A control arm 72 is fastened on the holder 58 engaged with the servo-drive 68. The control arm 72 carries at its end a support element 74, here shown as a circle. This support element can be a gripping device designed in a known manner or a guide, but can also be a machine tool, and is hereinafter referred to in short as a gripper.

In the case of the shortest length of the column 67, illustrated at the right of the median line in FIG. 7, the gripper 74 is moved, in the case of a tilt triggered by the column 69, across the maximum possible angle $\alpha$ in a circular arc 76. In the case of the maximum extension of the column 67 of the servo-drive 68, the gripper 74 can be moved with the column 69 in the path 78. The gripper can therefore cover any point inside an area determined by the points I to IV as maximum achievable points. The radial distance d between the circular arcs 76 and 78 is around 25 μm in practical operation. A value of 50 μm may also be achievable. In the case of a tilt angle of a few ten minutes of arc, a distance of about the same size can be achieved between I and IV. The gripper can therefore cover an area which for example has an edge length of 25 to 50 μm. A micropositioner designed in this way allows micropositioning, for example, in the case of splicing of monomode glass fibre. Monomode glass fibre, which finds application in glass fibre cable, has a diameter of 3 μm. A further possibility of application is, for example, in the accurate positioning of bond wires in highly integrated electronic circuits.

The use of piezo discs according to the embodiment in FIG. 3 allows tilting about at least one further tilting axis. In this way the gripper can also be moved spatially so that a positioning volume can then be achieved with a side length of 25 μm, for example.

The micropositioner according to FIG. 7 can be used with its support 64 in a general positioner, whereby the micropositioner can, for example, be moved into an operating position.

What we claim as our invention and desire to secure by Letters Patent of the United States is:

1. A piezoelectric drive for producing translation and angular movement comprising a plurality of first and second piezo discs arranged in a column, said discs being polarized in such a way that the direction of extension of the column and the direction of the electrical field are substantially parallel, said first and second piezo discs each having contact surfaces on the opposite sides thereof, the contact surfaces on said first piezo discs being substantially continuous, the contact surface on one side of each of said second piezo discs being symmetrically divided into a plurality of separate contact segments, each of said contact surfaces and each of said contact segments having a separate electrical contact thereon, means for effecting initial compression of said discs and a support engaging one end of said column and positioning the other end thereof in engagement with a component to be adjusted.

2. A piezoceramic servo-drive according to claim 1, in which there are two said symmetrical contact segments on a side of at least one of said discs.

3. A piezoceramic servo-drive according to claim 1, in which there are four said symmetrical contact segments on a side of at least one of said discs.

* * * * *